United States Patent
Zhao et al.

(10) Patent No.: US 8,937,281 B2
(45) Date of Patent: *Jan. 20, 2015

(54) METHOD FOR EXAMINING A SAMPLE BY USING A CHARGED PARTICLE BEAM

(75) Inventors: Yan Zhao, San Jose, CA (US); Jack Jau, Los Altos Hills, CA (US); Wei Fang, Milpitas, CA (US)

(73) Assignee: Hermes Microvision, Inc., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/541,618

(22) Filed: Jul. 3, 2012

(65) Prior Publication Data

US 2012/0273678 A1    Nov. 1, 2012

Related U.S. Application Data

(63) Continuation of application No. 12/491,013, filed on Jun. 24, 2009, now Pat. No. 8,299,431.

(51) Int. Cl.
*H01J 37/26*  (2006.01)
*H01J 37/28*  (2006.01)

(52) U.S. Cl.
CPC ............... *H01J 37/265* (2013.01); *H01J 37/28* (2013.01); *H01J 2237/2817* (2013.01)
USPC ........... 250/307; 250/306; 250/309; 250/310; 250/311; 430/296

(58) Field of Classification Search
USPC ........... 250/306, 307, 309, 310, 311; 430/296
See application file for complete search history.

(56) References Cited

U.S. PATENT DOCUMENTS

| | | | |
|---|---|---|---|
| 6,710,342 B1 | 3/2004 | Jau et al. | |
| 6,881,956 B1 | 4/2005 | Jau et al. | |
| 8,299,431 B2 * | 10/2012 | Zhao et al. | 250/307 |
| 2002/0117619 A1 * | 8/2002 | Gunji et al. | 250/310 |
| 2006/0133661 A1 * | 6/2006 | Takeda et al. | 382/149 |
| 2008/0302962 A1 * | 12/2008 | Takahashi et al. | 250/310 |

* cited by examiner

*Primary Examiner* — Nicole Ippolito
(74) *Attorney, Agent, or Firm* — Muncy, Geissler, Olds & Lowe, P.C.

(57) ABSTRACT

A method for examining a sample with a scanning charged particle beam imaging apparatus. First, an image area and a scan area are specified on a surface of the sample. Herein, the image area is entirely overlapped within the scan area. Next, the scan area is scanned by using a charged particle beam along a direction neither parallel nor perpendicular to an orientation of the scan area. It is possible that only a portion of the scan area overlapped with the image area is exposed to the charged particle beam. It also is possible that both the shape and the size of the image area are essentially similar with that of the scan area, such that the size of the area projected by the charged particle beam is almost equal to the size of the image area.

22 Claims, 19 Drawing Sheets

| A1 | A2 | A3 | A4 | A5 |
|---|---|---|---|---|
| A6 | A7 | A8 | A9 | A10 |
| A11 | A12 | A13 | A14 | A15 |
| A16 | A17 | A18 | A19 | A20 |
| A21 | A22 | A23 | A24 | A25 |
| A26 | A27 | A28 | A29 | A30 |

| A1 | A2 | A3 | A4 | A5 |
|---|---|---|---|---|
| A6 | A7 | A8 | A9 | A10 |
| A11 | A12 | A13 | A14 | A15 |
| A16 | A17 | A18 | A19 | A20 |
| A21 | A22 | A23 | A24 | A25 |
| A26 | A27 | A28 | A29 | A30 |

# METHOD FOR EXAMINING A SAMPLE BY USING A CHARGED PARTICLE BEAM

RELATED APPLICATIONS

This application is a Continuation of application Ser. No. 12/491,013 filed on Jun. 24, 2009 now U.S. Pat. No. 8,299,431.

FIELD OF THE INVENTION

The present invention generally relates to a method for examining a sample with scanning charged particle beam imaging apparatus, and more particularly to a method for generating an image of a sample by scanning the charged particle beam over the sample in a tilted angle over a least scan area that can render the desired image size with reduced aliasing effect and charging effects, enhanced image contrast and efficiency.

DESCRIPTION OF THE RELATED ART

The scanning charged particle beam imaging apparatus, such as scanning electron microscope (SEM), is commonly used to form images which reveal the detailed surface information of a sample. A scanning charged particle beam imaging apparatus includes at least a charged particle source to generate the charged particle beam of a certain energy, one or more electron lenses to focus the charged particle beam into a fine probe at the surface of the sample, at least a set of deflector to scan the charged particle beam probe over an area on the sample to excite charged particles from the sample surface, for example, secondary charged particles or backscattered charged particles. At least a charged particle detector collects these excited charged particles and converts them to electrical signals to form images. The strength of the signal (excited charged particles) usually is a function of surface roughness, materials, and/or charging level at the excitation points. Hence, the obtained images can be further processed or analyzed for acquiring a wide variety of detailed information or characteristics of the sample, including surface topography, composition and other properties such as electrical conductivity.

In the semiconductor industry, the scanning charged particle beam imaging apparatus, for example, SEM, is popularly used in different stages of integrated circuit device fabrication process for Critical Dimension (CD) measurement, defect inspection, defect review, etc. The samples to be examined can be a wafer, a mask, or any template used for producing patterns on wafer, or on mask, or even template for reproducing template itself. FIG. 1A illustrates the prior arts of image-based wafer examination. The examination can also be applied to mask or template. The purposes of examination can also be CD measurement, defect inspection/review, and so on. The wafer 100 comprises lots of dies 101, and all dies 101 have substantially identical layout of micro-structure. Herein, to simplify description and figure, the internal structures of each die 101, such as effective IC device area and scribe line, are omitted. Moreover, the examination of the wafer 100 usually is focused on only some specific portions 102 of each or specific dies 101, which are called regions of interest (ROI) hereafter. The ROI 102 usually corresponds to areas on the wafer 100 where the defects tend to appear, where the layout has more variations, where the yield of a fabrication process trends to be low, and so on. Limited by the maximum image size at a given condition, known as Field of View (FOV), the charged particle beam imaging apparatus can only view a small portion of region at one time. In most cases, the FOV can be much smaller than the ROI. Thus, multiple image areas 103 need to be taken to cover the entire ROI. Therefore, as shown in FIG. 1B, to examine the ROI 102 of die 101, the ROI 102 is firstly divided into sub-regions (image areas), A1, A2, . . . based on the FOV. For imaging each sub-region (image area) 103, the ideal case is that its corresponding scan area 104 exactly equals to the size of each image area 103, but in practices, scan area 104 is usually larger than the image area 103 in order to tolerate the unavoidable scanning overhead.

In some prior arts as shown in FIG. 1C, the charged particle beam is raster scanned in the direction parallel to the die orientation, as indicated by the arrows, over a scan area 104 (usually in a rectangle or square shape) to generate an image of image area 103. Herein, the image area 103 also corresponds to the FOV of an image not larger than the scan area 104. This process is repeated until the entire ROI are covered. However, in the normal case of semiconductor device fabrication, the image area 103 usually consists of micro structures arranged substantially in the orientation either parallel or perpendicular to the die orientation. If there is at least one micro-structure with a sharp horizontal edge, scanning the charged particle beam along the horizontal edge may have two different influences to the image: (1) at low magnification operation where the charged particle probe size is smaller than the image pixel size, the focused charged particle beam probe may not be kept precisely along the edge of this horizontal edge while scanning, leading to inconsistent and abrupt change of edges signals. This would result in stepped edge or irregular zigzag edge in the obtained image, which is called aliasing effect. (2) at high magnification operation where the probe size and pixel size getting smaller, scanning the charged particle beam along the sharp edge induce too much charging which further restrain the escape of secondary charged particles. Thus, the edge sharpness will be smeared and the edge contrast will be reduced too. Both cases will cause troubles to image examination. For automatically defect detection, edge aliasing will be falsely detected as a defect or cause high false rate, while poor edge sharpness and contrast will lower the detection sensitivity of defects associated with the edge.

In normal semiconductor device fabrication, the layouts of the basic components (microstructures) inside a die at different process layers are organized in such a way that their edges are either parallel or perpendicular to the die edges. Thus there is a high possibility of scanning the charged particle beam parallel to the pattern edge. For avoiding the adverse issues (false defects or poor edge sharpness as described above) associated with the parallel-edge scanning, some prior arts (such as U.S. Pat. No. 6,710,342 and U.S. Pat. No. 6,881,956), as shown in FIG. 1D, raster scan the charged particle beam over a scan area 104 along a direction that is at a tilted angle neither parallel nor perpendicular to the orientation of the dies on the wafer (which is called tilt scan). Herein, the scan line is illustrated as the arrow shown. Therefore, because the tilted scan line is not parallel or perpendicular to die orientation, the charged particle beam essentially will not be scanned along the edge of microstructures and then the abovementioned adverse effects can be effectively minimized. However, there will be other practical issues arising from the tilt scan. First, because the image area 103 and the scan area 104 has different orientations but same shape, the scan area 104 must be obviously larger than a corresponding image area 103 so that the image area 103 is entirely covered by the scan area 104. Then, the required time to scan whole scan area 104 is obviously increased when the scan rate is fixed, and then the throughput of the scanning charged particle beam imaging apparatus is lowered. Second, when a specific image area 103 is examined, such as A8, the corresponding scan area 104 must be overlapped with at least one neighboring image area(s) 103, such as A3, A7, A9 and A13, as shown in FIG. 1D. This is because each image area 103 is close to other image area(s) 103. Then, when the scan area 104 is scanned for examining the specific image area 103 (A8), the charged particle beam must also be projected into a portion of the neighboring image area(s) 103 (A3, A7, A9 and A13) and potentially change the surface property of these neighboring image area(s) 103 (A3, A7, A9 and A13). For example, the projection of charged particle beam may at least induce electrical charging and burn mark. Hence, when any of the neighboring image area 103 (A3, A7, A9 and A13) is examined later, the acquired images may show some artifacts which are not the image of the original surface but are caused by the overlapped scanning.

Moreover, as shown in FIG. 1E, if an image area 103 contains periodical microstructures along a specific direction, such as the orientation of the image area 103, and the image is also captured in such a way that the orientation of the periodic pattern in the image is parallel or perpendicular to the edge of image, it will be straightforward in image processing to examine the microstructures by shifting image one or multiple periods in one direction and comparing the neighboring repeating patterns within the corresponding image. However, if the image is captured in a way that the periodic patterns are not aligned parallel or perpendicular to the edge of image, as shown in image 105, then the conventional image processing can not be directly applied and an additional processing is needed to convert the tilted image 105 to a non-tilted image 106 where the orientation of the periodic pattern 106 becomes parallel or perpendicular to the edge of image.

Accordingly, the examination of a sample by a scanning charged particle beam imaging apparatus is not effective enough. It is desired to develop new method for more properly and effectively examining a sample by using a charged particle beam.

SUMMARY OF THE INVENTION

One approach of this invention is a method for examining a sample with scanning charged particle beam imaging apparatus. Herein, a sample is examined by scanning a charged particle beam on a scan area (area to be scanned) of the sample in a titled angle neither parallel nor perpendicular to the orientation of an image area (area to be examined by analyzing its image) of the sample, with optimized charged particle beam control to divert or turn off the charged particle beam to keep it from reaching the sample when the charged particle beam is positioned outside the image area. This will keep the adjacent image areas untouched by the charged particle beam thus avoiding possible issues such like electrical charging and burn mark for the adjacent images.

Another approach of this invention is a method for examining a sample with scanning charged particle beam imaging apparatus. Herein, a sample is examined by scanning a charged particle beam on a scan area of the sample in a titled angle neither parallel nor perpendicular to the orientation of image area on the sample, with optimized scanning control to fit the scan area as precise as possible to just contain the image area. This not only keeps the adjacent area substantially untouched by the scanning charged particle beam for avoiding possible adverse effect such like charging and burn mark, but also reduces the time spending on scanning outside image area.

A further approach of this invention is a method for examining a sample with scanning charged particle beam imaging apparatus. Herein, a sample is examined by scanning a charged particle beam on a scan area of the sample in a titled angle neither parallel nor perpendicular to the orientation of image area on the sample, with optimized scanning control to fit the scan area as small as possible to just contain the image area and optimized charged particle beam control to divert or turn off the charged particle beam from reaching the sample when the charged particle beam is positioned outside the image area. Hence, even a portion of the scan line still is outside the image area, owing to the practical fact that the scanning charged particle beam imaging apparatus requires a response time to switch the scan line of the charged particle beam, the charge particle beam still is substantially not projected outside the image area because the required response time for diverting and/or turning off charged particle beam is significantly less than the required response time for switching the scan line. Clearly, this approach has the advantages of both previous approaches.

Furthermore, if the analysis does require a non-tilted image, the invention can further have an optional image process for converting the tilted image into a smaller non-tilted image. For example, if the image will simply be used for comparison with another image of the similar pattern for detecting difference, it is not necessary to convert the tilted image into a non-tilted one. In wafer inspection, this mode of defect detection is called die to die mode. For another example, if the image contains periodical patterns along a direction which is not parallel or perpendicular to the tilted scan direction, and the further process need to compare the pattern difference between the neighboring repeating patterns within one image, the image may need to be converted to non-tilted image for easy comparison. In wafer inspection, this mode of defect detection is known as Array Mode.

One proposed method for examining a sample with scanning charged particle beam imaging apparatus comprising the following steps. First, select a tilted scan angle as well as tiled scan size for each scan area to be scanned by the charged particle beam, and then determines the maximum non-tilted scan or say image size obtainable from the tilted scan area. Second, specify a sampling region over the surface of a sample, and divided it into at least one sub-region(s). Herein, each sub-region is equal to or less than the maximum non-tilted area size obtainable from the scan area, and the number of sub-regions corresponds to the number of scan areas need to be scanned. Herein, each sub-region can be viewed as an image area. Next, for the tilted scanning process for acquiring the image of each sub-region, calculate the area need to be blanked when charged particle beam is positioned within it and determines the blanking parameters (starting time and length) and sequence. Then, scan each sub-region at the given tilted angle neither parallel nor perpendicular to an orientation of a corresponding sub-region. Herein, for each tilted scanning process, the charged particle beam is blanked when the charged particle beam is projected outside a corresponding image area. Clearly, the actually scan time may not be reduced for each titled scanning process, but the actual area where the charged particle beam is really projected into is reduced close to the size of each image area. Finally, the tilted images acquired by the tilted scanning processes can be used for further analysis, such as defect detection and defect review. Moreover, if necessary, the non-tilted images are reconstructed and formed based on the tilted images from the tilted scanning processes.

Another proposed method for examining a sample with scanning charged particle beam imaging apparatus comprising the following steps. First, select a tilted scan angle as well tiled scan size for each scan area to be scanned by the charged particle beam, and then determines the maximum non-tilted size obtainable from the tilted scan area. Second, specify a sampling region over the surface of a sample, and divided it into at least one sub-region(s). Herein, each sub-region is equal to or less than the maximum non-tilted area size obtainable from the tilted scanning process, and the number of sub-regions corresponds to the number of scan areas need to be scanned. Herein, each sub-region can be viewed as an image area. Next, calculate the effective area for each tilted scanning process and determine the optimal scan length of each line, line by line, at least to cover the desired non-tilted image area. Then, scan each sub-region at the given tilted angle. Herein, the scan lines that the charged particle beam is moved along is restrained to cover essentially only the sub-regions. Hence, the actually scan time will be reduced for each sub-region, and the actual scanned area also be reduced close to the corresponding non-tilted image size. Finally, the tilted images acquired by the tilted scanning processes can be used for further analysis, such as defect detection and defect review. Moreover, if necessary, the non-tilted images are reconstructed and formed based on the tilted images from the tilted scanning processes. Besides, because the required response time for blanking the charged particle beam is usually smaller than the required response time for switching the routes, also because the trajectory of the projected charged particle beam usually can not be abruptly changed without any buffer zone, it is optional to blank the charged particle beam for portions of the scan lines outside the sub-region right to be scanned, such that the charged particle beam is almost only projected into the sub-region to be examined.

In the present invention, the charged particle beam is raster scanned in a rectangular shape (equal length of each line scan) along a direction neither parallel nor perpendicular to the orientation of the image area, the charged particle beam is blanked out from reach the sample when the scan position outside target image area, thus not expose to charged particle beam. Moreover, the raster scan lines can be in a rhomboid shape (variable length of each line) to best fit the image area, thus minimized the scanning time and extra area exposed to charged particle. Therefore, the method disclosed in the present invention may not only reduce the possibility of incurrence of the aliasing effect on edges but also increase the throughput and reduce unnecessary disadvantageousness(s).

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1C illustrates a schematic view of a prior art, non-tilt scan.

FIG. 1D illustrates a schematic view of another prior art, tilt-scan.

FIGS. 4G to 4I illustrate three scanning schemes respectively instead of the steps 4 and 5 illustrated in FIGS. 4D and 4E.

DETAILED DESCRIPTION OF THE INVENTION

Figure 1A:
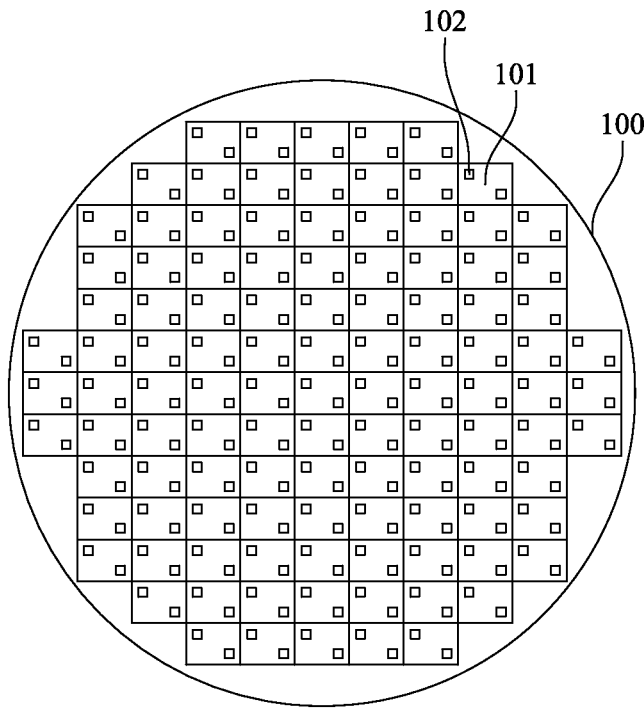
FIG. 1A illustrates a schematic view of a wafer having some dies.

Reference is made in detail to the present embodiments of the invention and the examples illustrated in the accompanying drawings. Wherever possible, the same reference numbers are used in the drawings and the description to refer to the same or like parts.

The disadvantages of the above prior arts can be briefly attributed to the following reasons: (1) The charged particles beam is projected on and moved along the edge of the microstructures inside the non-tilted image area. (2) The tilted scan area is clearly larger than the effective image area, thus the required time to scan the whole tilted scan area is clearly longer than the required time to scan the effective non-tilted image area. (3) One titled scan area may overlap with several neighboring image areas and then these neighboring image areas may be projected by the charged particle beam when they are not examined (especially before they are examined). Hence, the surface conditions of these image areas may be degraded or changed before they are examined.

Clearly, the latter prior art(s), tilted scan as shown in FIG. 1D, can improve the disadvantages of the former prior art(s), non-tilted scan a shown in FIG. 1C. Then, once the disadvantages of the latter prior art(s) in FIG. 1D are improved, the scanning charged particle beam imaging apparatus can more effectively examine the sample without these conventional disadvantages. Herein, by carefully analyzing the reasons of the disadvantages of the latter prior art(s), the key issue can be shortly summarized as below: the whole area to be scanned with projection of charged particle beam is significantly larger than the whole area where a corresponding image is required for further analyzing.

By further analyzing the current technology of the scanning charged particle beam imaging apparatus, some characteristics can be used to solve the above key issues. First, the current scanning charged particle beam imaging apparatus usually can blank and/or turn off the charged particle beam, if necessary, such that the scanned sample is not projected by the charged particle beam. Second, the scan lines are flexible and adjustable, such that each scan line can be independent on other scan lines and then both the length and the size of the scan area can be adjustable.

Accordingly, the invention provides two ways to solve the disadvantages of these prior arts. FIG. 2A to FIG. 2F illustrates the essential concept of the two proposed ways. Herein, the image areas are illustrated as thin continuous lines and the scan area is illustrated as thin dashed lines. Herein, the scan lines of the charged particle beam is illustrated as bold continuous lines when the charged particle beam is projected on the image area and illustrated as bold dashed lines when the charged particle beam is not projected on the image area.

Figure 2A:
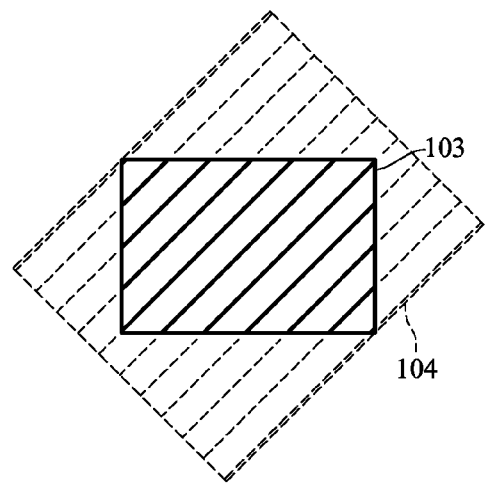
FIG. 2A to FIG. 2F briefly illustrates some proposed ways to solve the disadvantages of the prior arts.
Figure 2B:
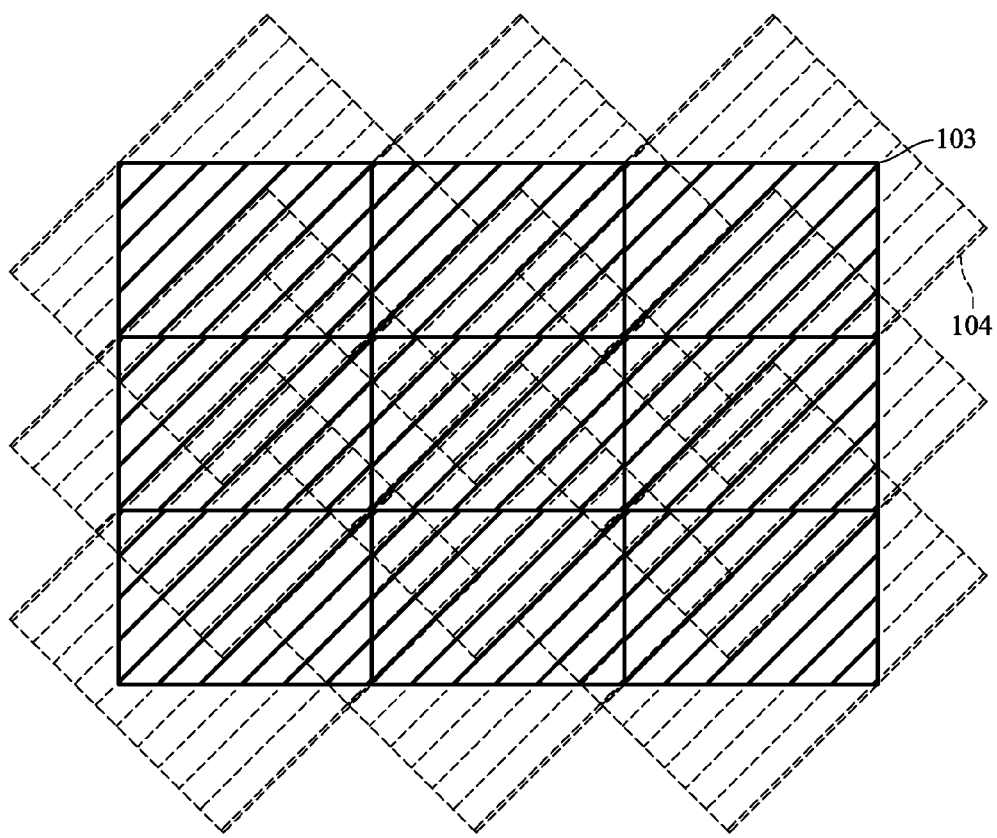
Figure 2C:
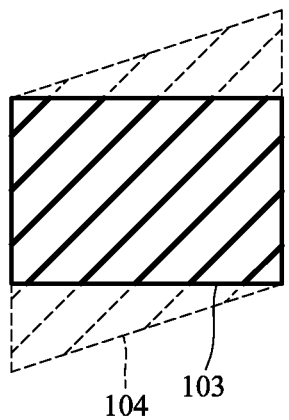
Figure 2D:
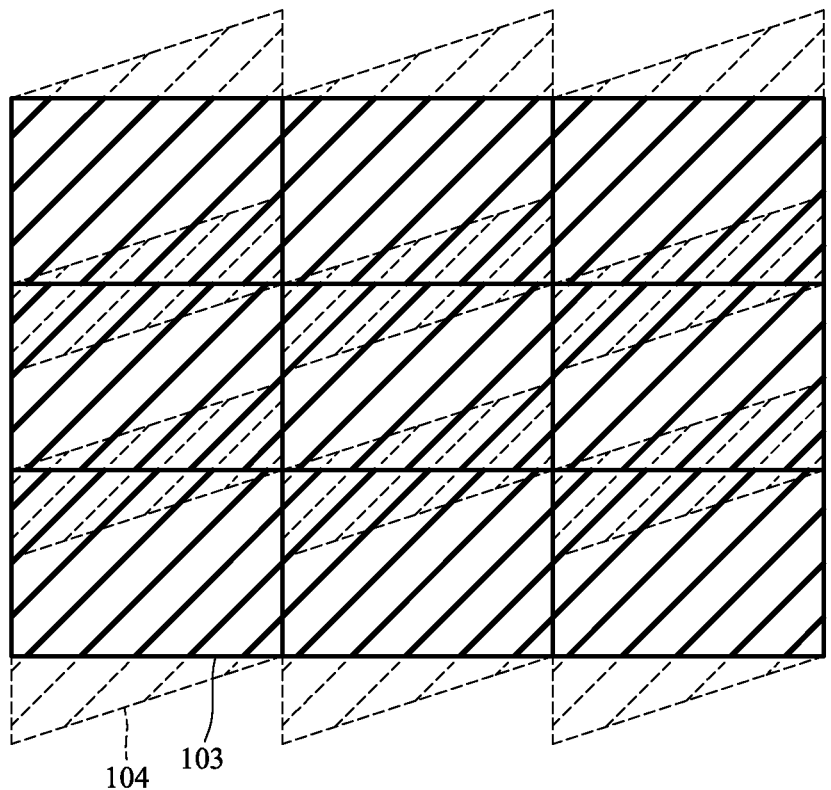

First, if a portion of the sample is not projected by the charged particle beam in an on-going scanning process, then no charging or burn mark will appear on the portion before the portion is projected in a later scanning process. Hence, as shown in FIG. 2A and FIG. 2C, a portion of a scan area 104 not overlapped with a corresponding image area 103 is not projected by the charged particle beam when the corresponding image area 103 is examined. In such situation, at least one neighboring image area overlapped with the portions of scan area 104 which are not projected by the charged particle beam will not be affected before the neighboring image area(s) is examined later. Moreover, FIG. 2B and FIG. 2D separately illustrates an application of FIG. 2A and FIG. 2C; both FIG. 2B and FIG. 2D illustrate a sampling region consisting of a plurality of image areas 103 located adjacent to each other. In FIG. 2B, two opposite vertexes of an image area 103 are located on two opposite sides of a corresponding scan area 104. Clearly, in FIG. 2C each image area 103 is imaged by using a corresponding scan area 104 in the way shown in FIG. 2A. After all image areas 103 have been scanned, each image area 103 is clearly to be projected by the charged particle beam only once. In other words, no overlapped projection is performed to the same image area 103. Hence, the conventional disadvantage of samplings affected by each other is effectively improved, even prevented. In FIG. 2D, two opposite sides of an image area 103 are located on two opposite sides of a corresponding scan area 104. Clearly, with the geometric relation between an image area 103 and a corresponding scan area 104 applied, this case also can avoid disadvantage induced by repeat projection of charged particle beam on the same image area 103. In short, FIG. 2B and FIG. 2D not only illustrate how the disadvantageousness induced by repeat projection of charged particle beam can be solved, but also emphasize that the geometric relation between an image area 103 and a corresponding scan area 104 is not limited.

Figure 2E:
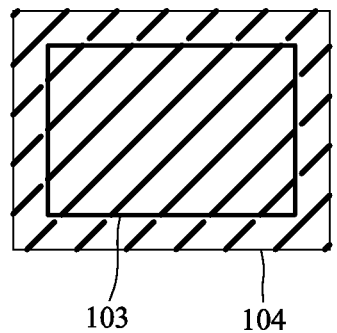
Figure 2F:
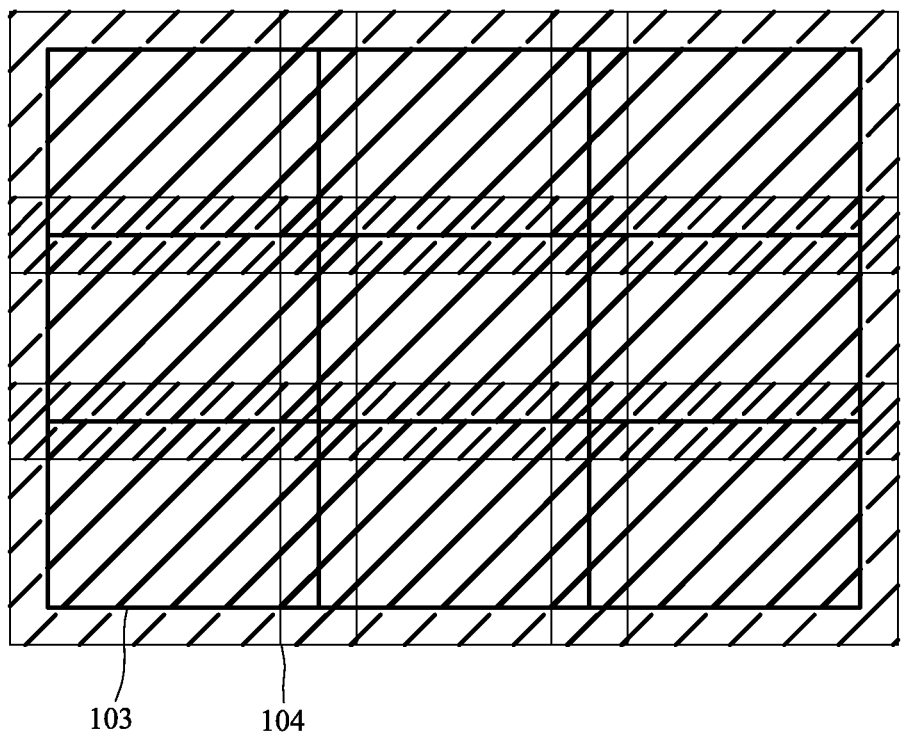

Second, as shown in FIG. 2E, if the size of a scan area 104 is almost equal to the size of the image area 103, then the scan time effectively spent on generating an image of area 103 is almost equivalent to the scan time to cover the minimum scan area 104. Hence, by properly adjusting the shape and the size of the scan area 104 to almost fit the shape and the size of the image area 103, the time wasted on scan portion of scan area 104 not overlapped with the corresponding image area 103 to be examined is minimized. Then, the throughput is effectively enhanced. Moreover, FIG. 2F illustrates an application of FIG. 2E, when FIG. 2F shows illustrate a sampling region consisting of a plurality of image areas 103 located adjacent to each other. In FIG. 2F, each scan area 104 is slightly larger than a corresponding image area 103, such that each scan area 104 is slightly overlapped with at least one adjacent scan area 104. Clearly, because the size of a scan area 104 is almost equal to the size of a corresponding image area 103 and each image area 103 is totally not overlapped with any neighboring image area 103, the size of the overlapped portions among adjacent scan areas 104 should be significantly smaller than the size of these image areas 103 to be examined Clearly, the required time to scan all scan areas 104 is almost equal to, only slightly larger than, the required time to scan all image areas 103 to be examined. Therefore, the conventional disadvantage that the throughput is decreased by scanning more areas than areas should be examined is effectively improved, even prevented.

One main difference between the invention and the prior arts of tradition approaches can be briefly disclosed as below. In the prior arts, the area to be scanned for acquiring an image is substantially identical to the area where the image is actually formed. Hence, in the prior arts, essentially only the area to be analyzed by image process is scanned. In contrast, for the two proposed approaches, the area to be scanned for acquiring image can be significantly different from the area where the image is actually formed as well. Hence, for the proposed approaches, the area to be analyzed can be significantly different from or substantially equal to the area to be scanned. Accordingly, FIGS. 2A~2D and FIGS. 2E~2F separately illustrate the relationship of scan area and image area of an general tilted scan image, as well as how the sampling region are covered or divided based on the designed image area and scan area. As noticed from the figures, if the whole sampling region is to be covered by tilted scan images, the scan areas can be overlapped each other for neighboring images and even exceed outside the sampling region, while the image areas can be well stitched and contained within the sampling region. In such way, the whole sampling region can be imaged and examined in sequence by multiple tilted images.

Therefore, as these prior arts are focused on the "title scan", when a sampling region to be examined is assigned, the invention may firstly select a tilted scan angle as well as a tilted scan size, and then determines a maximum non-titled image size obtainable from a titled scan area with the tilted scan angle and the tilted scan size. Next, divide the sampling region into some sub-regions, which may be viewed as image areas. Herein, for different image areas, the corresponding tilted scan areas may be equal or different, although it is more practical to have equivalent tilted scan areas for different image areas. Herein, the maximum titled scan size is limited by the maximum F.O.V. of the scanning charged particle beam imaging apparatus at a given condition. Herein, for each image area, the size of the image area is selected not to be larger than the maximum non-tilted image size a corresponding titled scan area can accommodate. After that, for each image area, the optimal scan lines, usually decided by two main parameters, starting positions and lengths, are determined so that the formed tilted scan lines at least cover the desired non-tilted image area, even to cover the whole scan area. Finally, each image area is scanned line by line with corresponding optimal starting positions and lengths, and then imaging of the whole sampling region is accomplished after all image areas are scanned. Clearly, the image acquired by scanning the sampling region can be used to review and/or detect any defect on the sampling region. Further, owing to the practical requirement of scanning back, as usual, the size of the scan area is not equal to the size of the image area, but is at least slightly larger than the size of the image area.

Moreover, by comparing FIGS. 2A~2D with FIG. 1D, a characteristic of the invention is clear. In the conventional "tilt scan", the charged particle beam is always projected on the scan area when different tilted scan lines are formed in sequence. In other words, in the conventional "tilt scan", scan along a scan line means all points (or pixels) on the scan line are projected by the charged particle beam in sequence. In contrast, in some examples of the invention as shown in FIGS. 2A~2D, the charged particle beam is only projected on portion of the scan area when different tilted scan lines are formed in sequence. In other words, in these examples, scan along a scan line does not express how the charged particle beam is projected on the scan line. Hence, it should be expressed as "scan with projection of charged particle beam" and/or "scan with blanking or turning off the charged particle beam" to precisely describe how different portions of the scan area are imaged by the charged particle beam. In the below description of the patent specification, such expressions are used to describe the invention.

Furthermore, as shown in FIG. 2A to FIG. 2F, after an end point of a scan line is scanned for acquiring image, the starting point of a next scan line is the next point to be scanned for acquiring image. In other words, these scan lines are scanned line by line. Clearly, a scanning back process is required to move from the end point of a former scan line to the starting point of a latter scan line. Herein, the scanning back process needs not to acquire any image signal. In other words, it needs not to collect and analyze any charged particles, such as electrons, from the sample. Hence, to compare the scanning process along the scan line for acquiring image by collecting and analyzing charged particles from the sample, the moving rate of the scanning back process can be significantly higher, which induces shorter moving period. Therefore, whether the charged particle beam is projected on the sample during the scanning back process is minor, the effect of the projected charged particle beam is small owing to the projection period on a point is shorter. Accordingly, the invention does not limit whether the charged particle beam is blanked out or turned off during the scanning back process, although it usually is not blanked out or not turned off for the conventional "tilt scan".

Furthermore, the microstructures inside an image area sometimes have periodical configuration along a direction parallel to or vertical to the orientation of the image area. In such situation, the periodical property of the microstructures can be simply used to analyze the differences between them by using a traditional image comparison algorithm. For example, shift the original image one or multiple periods along the horizontal or vertical pixel direction (either edge of image) and then comparing with the original image. However, when the image area is scanned along a direction neither parallel to nor vertical to the orientation of the image area, the periodic orientation of patterns in the acquired tilted image is neither parallel nor vertical to the orientation of the image edges. Then, it will be difficult to compare periodic patterns using traditional image comparison process as there is no simple periodicity in the orientation parallel or vertical to image edges. Therefore, in order to be compatible with traditional image comparison process periodic pattern for inside image, the invention can further have a step and a device for rotating the tiled image into a non-tilted image. For example, if the angle between the tilt scan direction and the orientation of the image area is Θ (such as 45°), then, the tilted image can rotated an angle −Θ (such as −45°) to form a non-tiled image. Herein, the patterns at the non-tilted angle will have a periodicity which proportional to the periodicity of the microstructures. Then, the conventional image comparison processes used by the conventional non-tilt scan can be applied to analyze the rotated non-tilted image. Finally, it should be emphasized that the invention does not and need not to limit the details of how to rotate the tilted image into a non-tiled image, and also does not and need not limit the details and variation of how the image process adopt to the none-tilted image comparison.

In the embodiments presented below, the discussion will be focused on how to control the scanning route for achieving an effective scan area just larger enough to delivery an image over an image area, and how to control the timing of beam projection module so that charged particle beam can only be projected to the sample during period the charged particle beam is scanning inside the image area. The general concepts are focused on the implementation of tilted scan. Other related implementations, for instance, how the sampling area is divided based on image size, how the image size and shape changes with the tilted angle, how the practical tilted scan angle is decided, and so on, are omitted. Furthermore, in the following embodiments, the image areas are illustrated as thin continuous lines and the scan area is illustrated as thin dashed lines. Moreover, the scan lines of the charged particle beam is illustrated as bold continuous lines when the charged particle beam is projected on the image area and illustrated as bold dashed lines when the charged particle beam is not projected on the image area.

FIGS. 3A to 3H illustrate a series of steps of a method for examining a sample with scanning charged particle beam imaging apparatus according to an embodiment of the present invention. In the present embodiment, the sample is examined by the following steps that a scan area and a corresponding image area are raster scanned by using numerous scan lines.

Figure 3A:
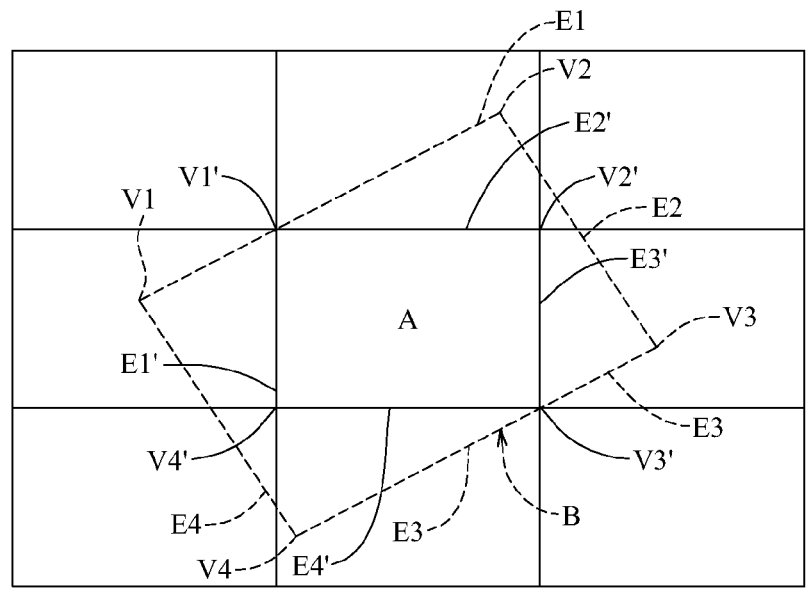
FIGS. 3A to 3H illustrate a series of steps of a method for examining a sample according to an embodiment of the present invention.

Referring to FIG. 3A, assuming the scanning charged particle beam imaging apparatus can reach a tilted scan area B over which an image of none-tilted area A inside B can be formed. The scan area B is of rectangular shape and defined by four sides E1, E2, E3, E4 and while the image area A is also of rectangular shape and defined by four side E1', E2', E3', E4'. Usually the image area A can be fully contained inside the scan area B, but at the situation of maximum size, the scan area B may intersect with image area A at least two vertices V1' and V3' of opposite sides E1 and E3 as indicated in the figure. Also in FIG. 3A~FIG. 3H, the scan direction is assumed to be parallel to sides E1 and E3, as indicate by scan direction D1, each line scans starts from side E4 and ends at side E2 for collecting image signals, and line to line has a fixed offset in the direction perpendicular to the line scan direction D1.

Figure 3B:
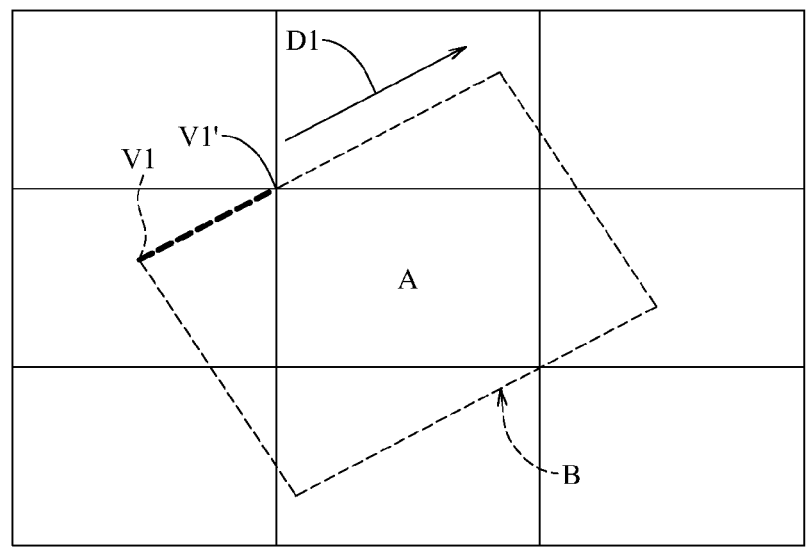

Referring to FIG. 3B, at step 1, when scanning along the first direction D1 from the vertex V1 to the vertex V1' of the image area A, the charged particle beam is blanked out or turned off. Thereafter, at step 2, when scanning through the vertex V1', the charged particle beam is projected on the image area A.

Figure 3C:
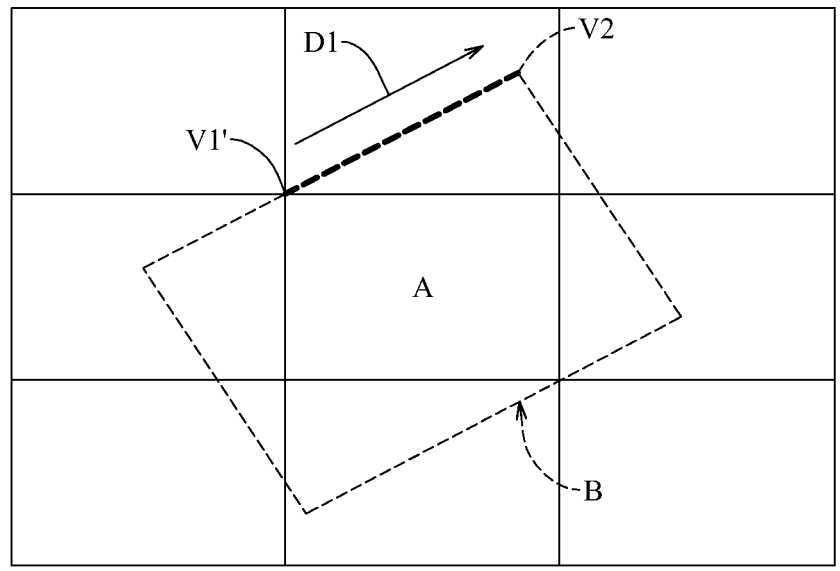

Referring to FIG. 3C, at step 3, when scanning along the first direction D1 from the vertex V1' to the vertex V2, the charged particle beam is blanked out or turned off. This finishes the first line scan.

Figure 3D:
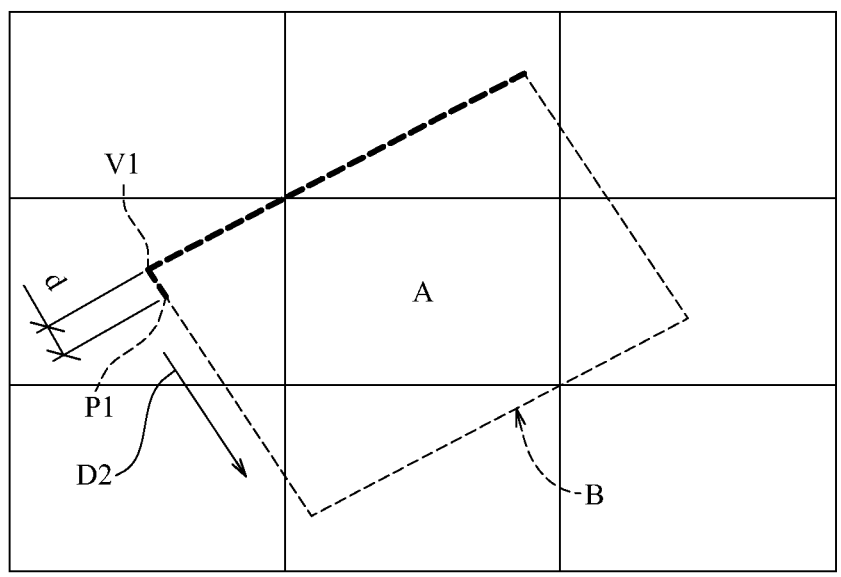

Thereafter, referring to FIG. 3D, at step 4, scan back in the substantially opposite direction to D1 from ending point V2 of first scan line on side E2 to the starting point P1 of second scan line on side E4, wherein the first scan line is in parallel to second scan line and has an fixed offset of distance d which corresponds to the pixel size of image. Herein, the charged particle beam could be blanked out or turned off during the moving back from the end of the previous scan line to the beginning of the second scan line, and the real trajectory of the charged particle beam during blanking is not limited thus not shown in the figures.

Figure 3E:
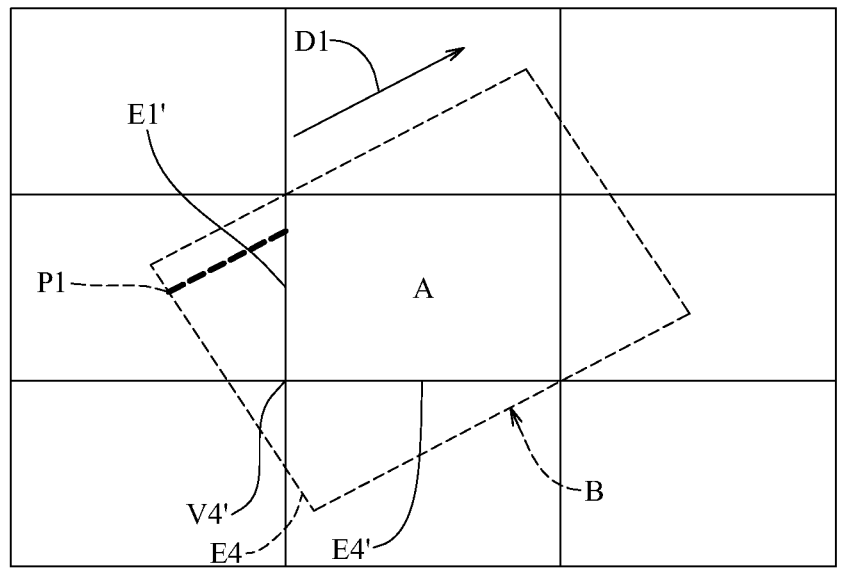

Referring to FIG. 3E, at step 5, when scanning along the first direction D1 from the first point P1 to the edge E1' of the image area A, the charged particle beam is blanked out or turned off.

Figure 3F:
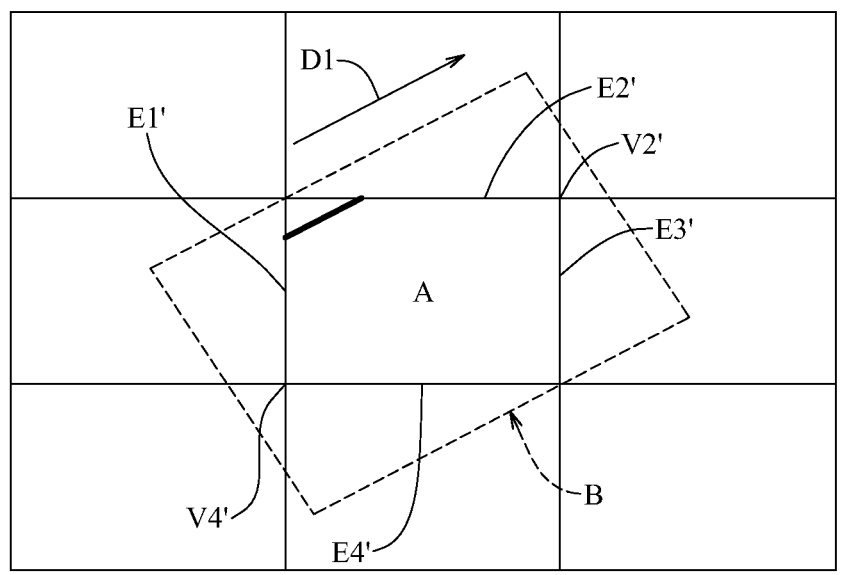

Next, referring to FIG. 3F, at step 6, when scanning along the first direction D1 within the image area A from the edge E1' to another edge E2' of the image area A, the charged particle beam is projected on the image area A.

Figure 3G:
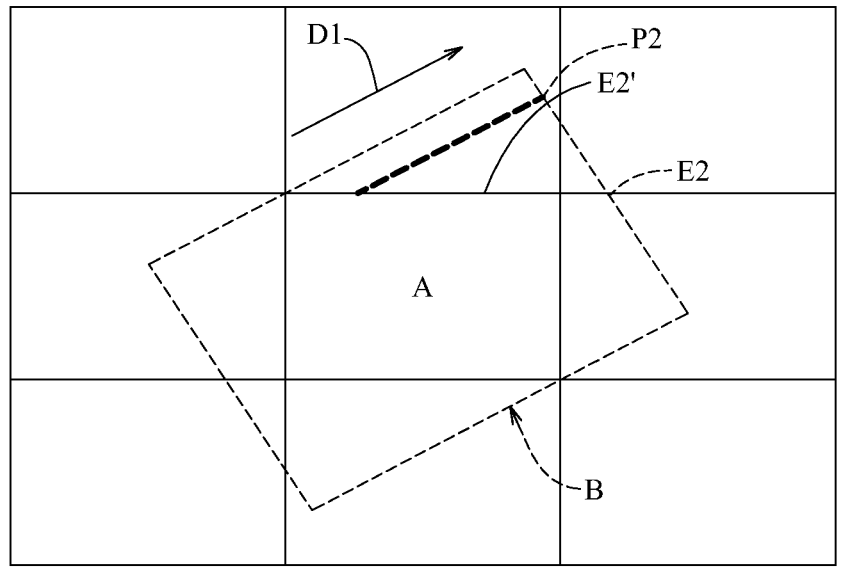

Next, referring to FIG. 3G, at step 7, when scanning along the first direction D1 from the edge E2' to the second point P2 on the edge E2, the charged particle beam is blanked out or turned off.

Figure 3H:
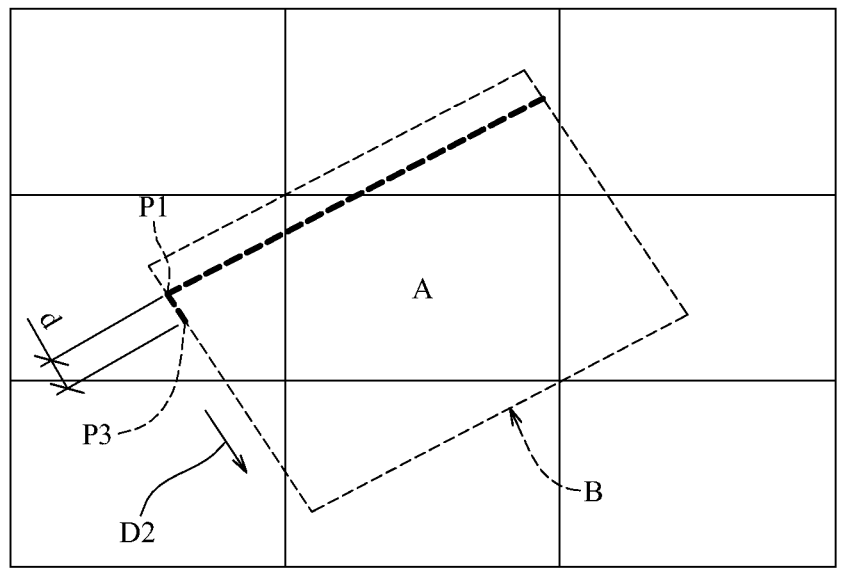

Thereafter, referring to FIG. 3H, at step 8, scans back from the ending point of second scan line on edge E2 to the starting point P3 of the third scan line on the edge E4, wherein the starting point P3 of the third scan line is away from the starting point P2 of the second scan line in a distance d, which usually is also equivalent to the image pixel size. Herein, again, the charged particle beam could be blanked out or turned off during the moving back, and the real trajectory of the charged particle beam is not restricted during the scanning back.

Accordingly, the scan area B may be entirely scanned by a raster scan that all scan lines are scanned in sequence with uniform distance between neighboring scan lines as described in the previous steps. Herein, to easily implement and use for image process, as usual, equal distances and equal pixel size is used to get a none distorted image. However, for the main characteristics of this invention, all distances among neighboring points can be equal or non-equal, and although all points can be listed along the edge E4 in sequence or in any order.

Noted that the charged particle beam may not only scan from the edge E4 to the edge E4' but also may from the edge E1 to another vertex V3' or another edge E3' of the image area A when repeating the step 5. In addition, the charged particle beam may not only scan from the edge E4' to the edge E1' but also may scan from the edge E4', the vertex V3' or the edge E3' to the edge E1', another vertex V2' or another edge E2' of the image area A when repeating the step 6. Furthermore, the charged particle beam may not only scan from the edge E1' but also from the vertex V2' or the edge E2' to the edge E2 when repeating the step 7. Therefore, the charged particle beam may scan the whole of the scan area B by repeating the steps 5 to 7 until the whole scan area B is scanned along the second direction D2 and essentially only the actual image area is projected by the charged particle beam. Thereby, the embodiment can effectively reduce the possibility of disadvantage on any portion of any neighboring image areas close to the image area A and overlapped with the image area B used for scanning the image area A. In summary, in one example the charged particle beam scans the scan area B along the first direction D1 at a tilted angle neither parallel nor perpendicular to edges of the image area A, and then the possibility of incurrence of an aliasing effect is effectively reduced.

FIGS. 4A to 4F illustrate a series of steps of a method for examining a sample with scanning charged particle beam imaging apparatus according to another embodiment of the present invention. The present embodiment is similar with the previous embodiment illustrated in FIGS. 3A to 3H that a scan area and a corresponding image area are raster scanned by numerous scan lines. However, in this embodiment described here, each scan line is offset with a give interval in a direction not perpendicular to the line scan direction. Moreover, the line to line offset is set in the direction parallel the die orientation.

Figure 4A:
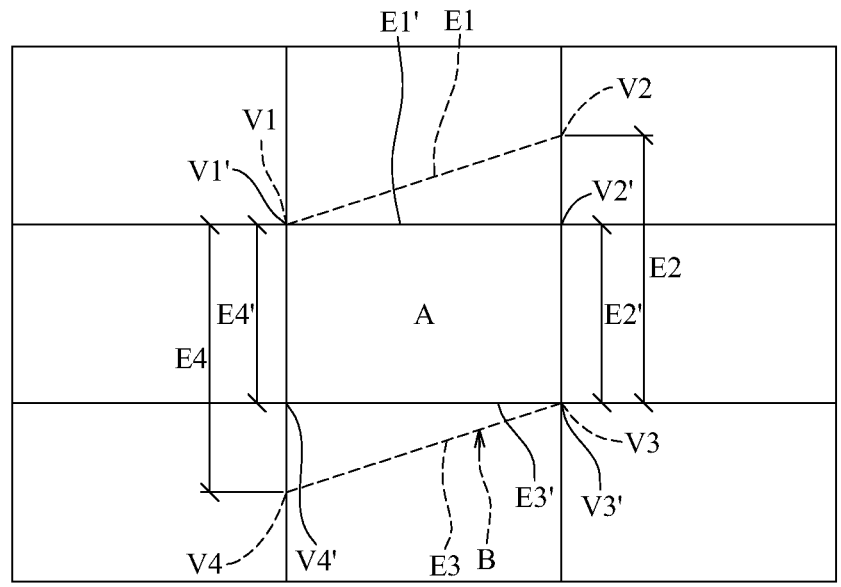
FIGS. 4A to 4I illustrate a series of steps of a method for examining a sample according to another embodiment of the present invention.

Referring to FIG. 4A, in more details, the image area A is overlapped with a scan area B, both areas have a different shape, but with two common edges facing opposite, for instance, E2' and E4' of the image area A overlapped with the edge E2 and the edge E4 of the scan area B respectively. Hereinafter, the process for scanning the scan area B by the charged particle beam is described as follows.

Figure 4B:
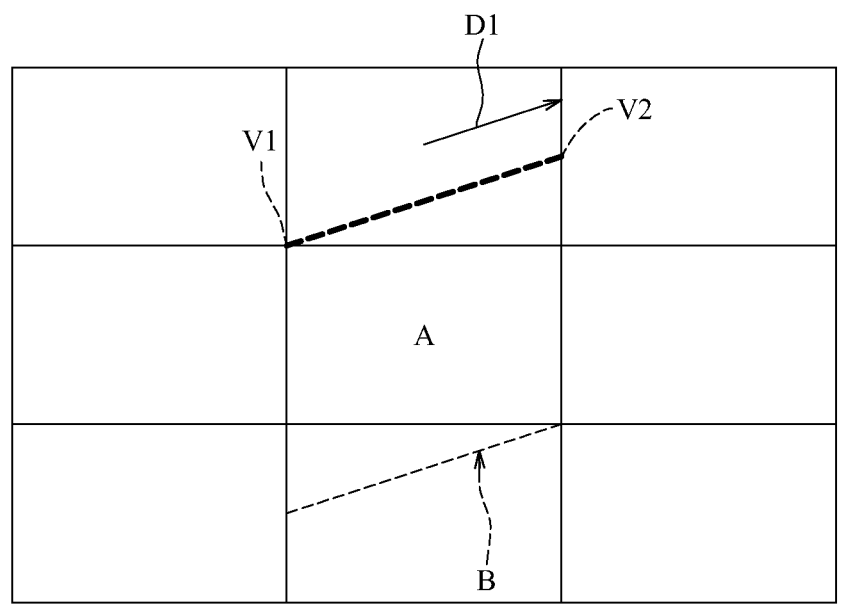

Referring to FIG. 4B, at step 1, when scanning through the vertex V1, the charged particle beam is projected on the image area A. Next, at step 2, when scanning along the first direction D1 from the vertex V1 to the vertex V2, the charged particle beam is blanked out or turned off.

Figure 4C:
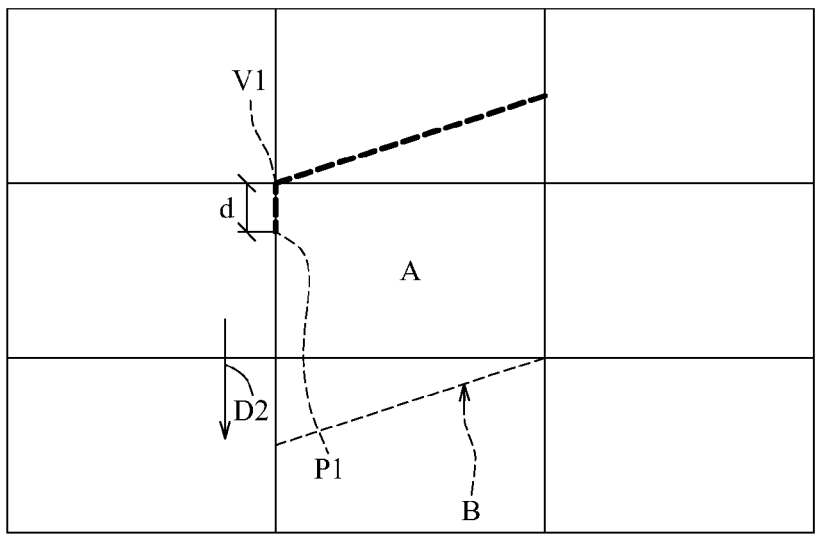

Thereafter, referring to FIG. 4C, at step 3, scan back to a first point P1 on the edge E4', wherein the first point P1 is a first distance d away from the vertex V1. Again, the charged particle beam could be blanked out or turned off during the scanning back, and the real trajectory of the charged particle beam is not limited during the scanning back.

Figure 4D:
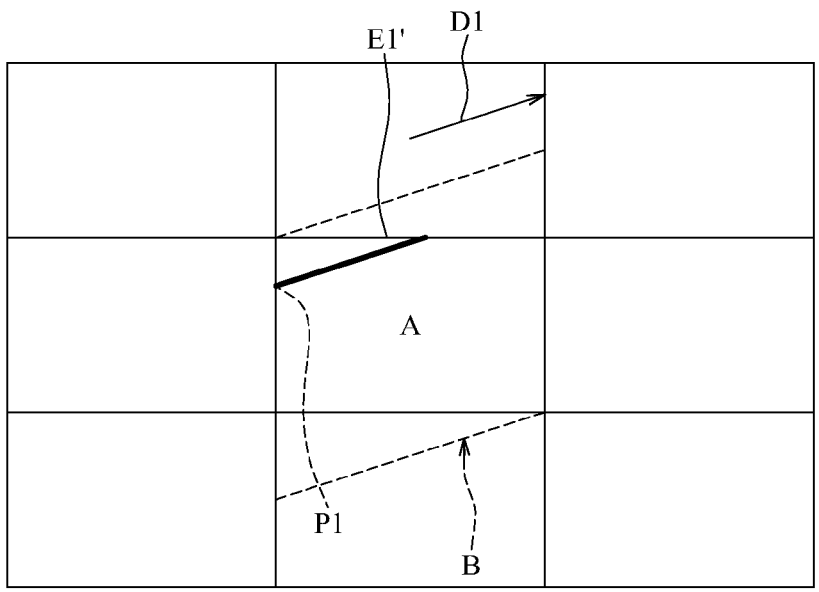

Referring to FIG. 4D, at step 4, when scanning along the first direction D1 within the image area A from the first point P1 to the edge E1', the charged particle beam is projected on the image area A.

Figure 4E:
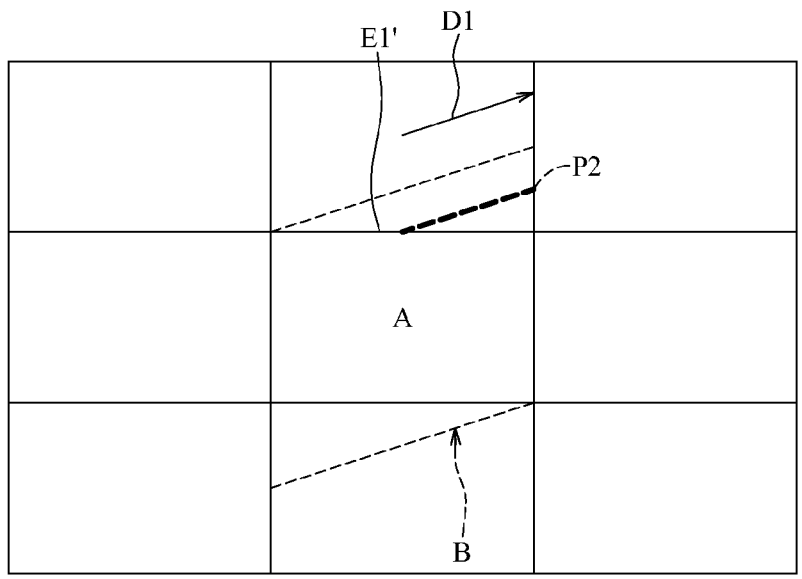

Next, referring to FIG. 4E, at step 5, when scanning along the first direction D1 from the edge E1' to the second point P2 on the edge E2', the charged particle beam is blanked out or turned off.

Figure 4F:
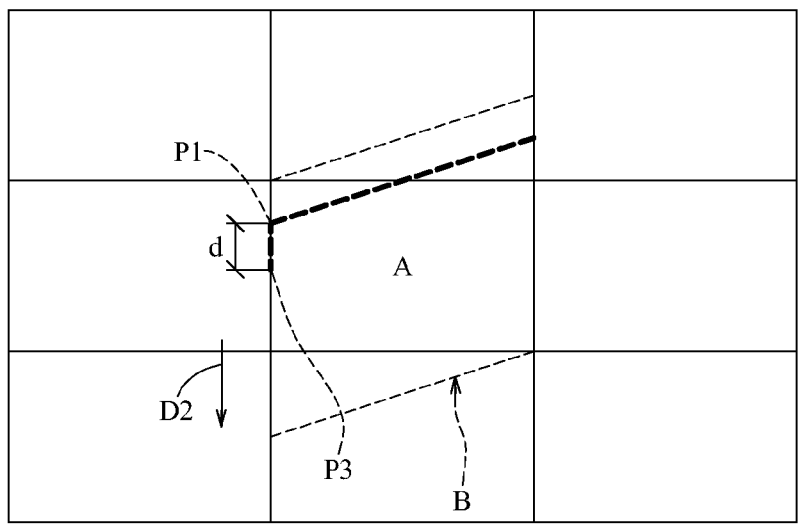

Thereafter, referring to FIG. 4F, at step 6, scan back to a third point P3 on the edge E4', wherein the third point P3 also is a distance away from the first point P1. Again, the charged particle beam could be blanked out or turned off during the scanning back, and the real trajectory of the charged particle beam is not limited during the scanning back. Herein, although all distance are equal in this embodiment, the invention does not particularly restrict this. Similarly, although all points listed in sequence along the edge E4' and E2' in this embodiment, the invention does not particularly restrict this.

Accordingly, after that, by repeating the above steps, the whole scan area B is scanned by a raster scan that all scan lines are scanned in sequence. Moreover, by comparing this embodiment with the pervious embodiment, it is clear that the invention does not limit how the scan area 104 encloses the image area 103.

Furthermore, because how the scan area 104 encloses the image area 103 is not limited, the relative geometric relation between the scan area 104 and the image area 103 is variable. Hence, the steps 4 and 5 illustrated in FIGS. 4D and 4E may be replaced by three scanning schemes with the steps respectively illustrated in FIGS. 4G to 4I. Note that when the charged particle beam scans along the first direction D1 from the edge E4' to the edge E2', the scanning steps are not limited to processing the steps 4 and 5 sequentially.

Figure 4G:
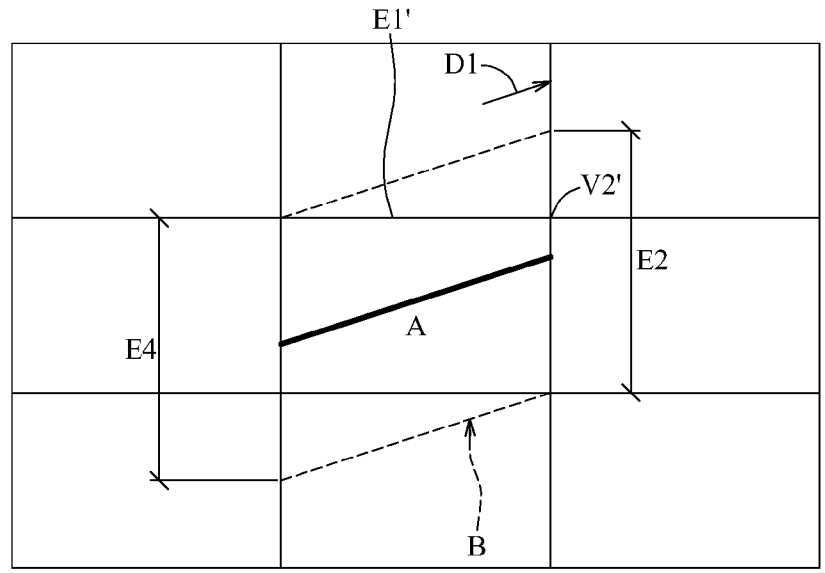

In more detail, referring to FIG. 4G, after scanning through the vertex V4', the scan line of the charged particle beam may be overlapped with the image area A. Hence, instead of executing the steps 4 and 5, the charged particle beam is continuously projected on the image area A when scanning along the first direction D1 from the edge E4' to the edge E2'.

Figure 4H:
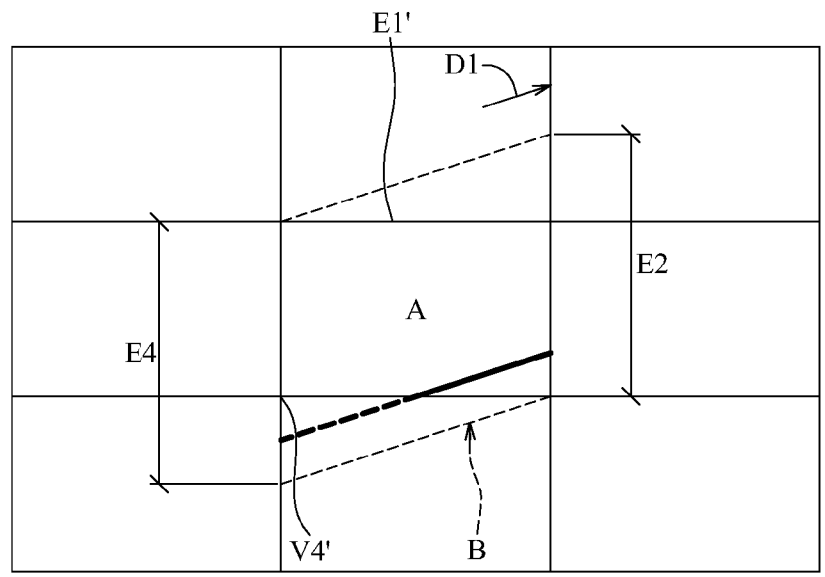

In addition, referring to FIG. 4H, after scanning through the vertex V4', the starting point of the scan line of the charged particle beam (illustrated as bold dashed lines) may be located outside the image area A, and the ending point thereof (illustrated as bold continuous s) may be confined within the image area A. Therefore, instead of executing the steps 4 and 5, the charged particle beam is blanked out or turned off firstly when scans the starting portion of the scan line and then projected on the image area A when scans the other portion of the scan line.

Figure 4I:
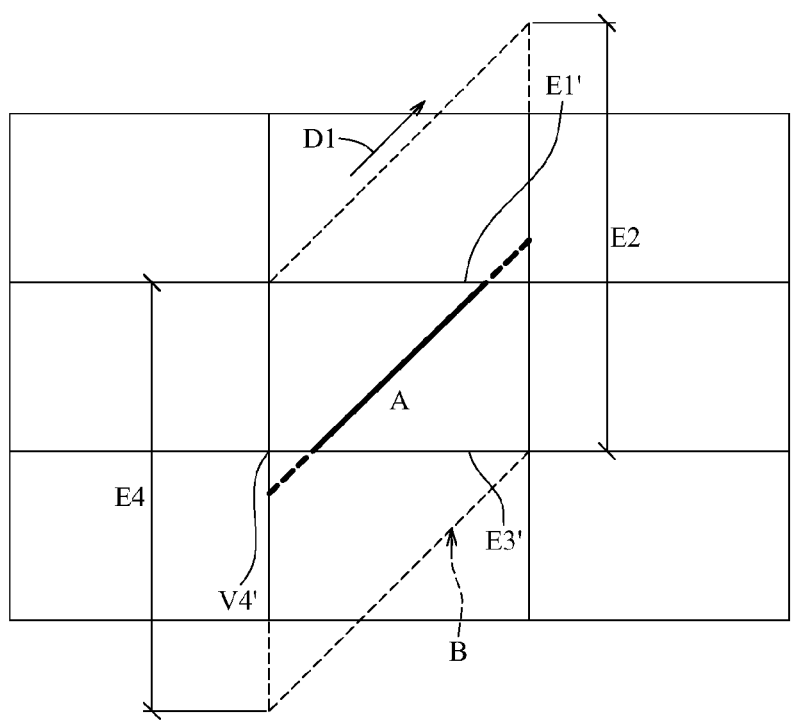

Furthermore, when the charged particle beam scans the scan area B along a first direction D1 illustrated in FIG. 4I different from the first direction D1 illustrated in FIGS. 4A to 4H, the scanning steps after scanning through the vertex V4' may be different from that illustrated in FIG. 4H. In more detail, referring to FIG. 4I, after scanning through the vertex V4', both the starting portion and the ending portion of the scan line of the charged particle beam (illustrated as bold dashed lines) may be located outside the image area A, and the middle portion thereof (illustrated as bold continuous lines) may be confined within the image area A. Therefore, instead of executing the steps 4 and 5, the charged particle beam is blanked out or turned off first when scanning on the starting portion of the scan line. Then, projected on the image area A when scanning on the middle portion of the scan line, and finally blanked out or turned off again when scanning on the ending portion of the scan line. Therefore, the charged particle beam may scan the whole scan area B by repeating the steps illustrated above until the whole scan area B is scanned along the second direction D2.

Accordingly, the charged particle beam may scan the whole scan area B by repeating the above steps until the all scan lines on scan area B are scanned along the second direction D2 in sequence, and also by being projected essentially only on the actual image area. Thereby, the embodiment can effectively reduce the possibility of disadvantageousness on any neighboring image areas being close to the image area A and overlapped with the image area B. In addition, the charged particle beam scans the scan area B along the first direction D1 at a tilted angle neither parallel nor perpendicular to edges of the image area A, and then the possibility of incurrence of an aliasing effect is effectively reduced.

Figure 1B:
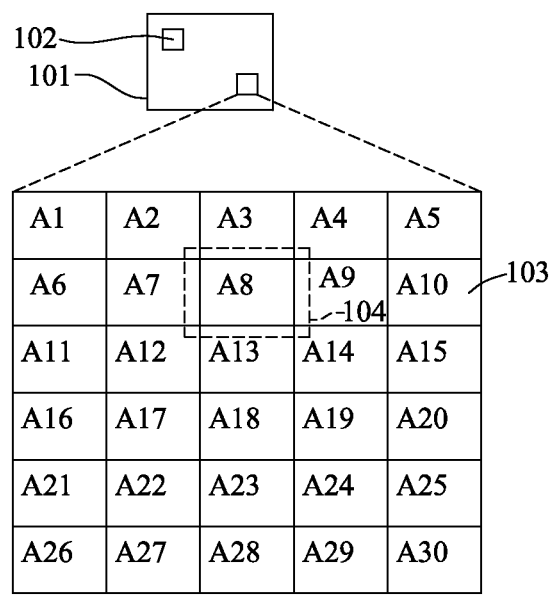
FIG. 1B schematically illustrates the relations among a die, a sampling region, an image area and a scan area.
Figure 1E:
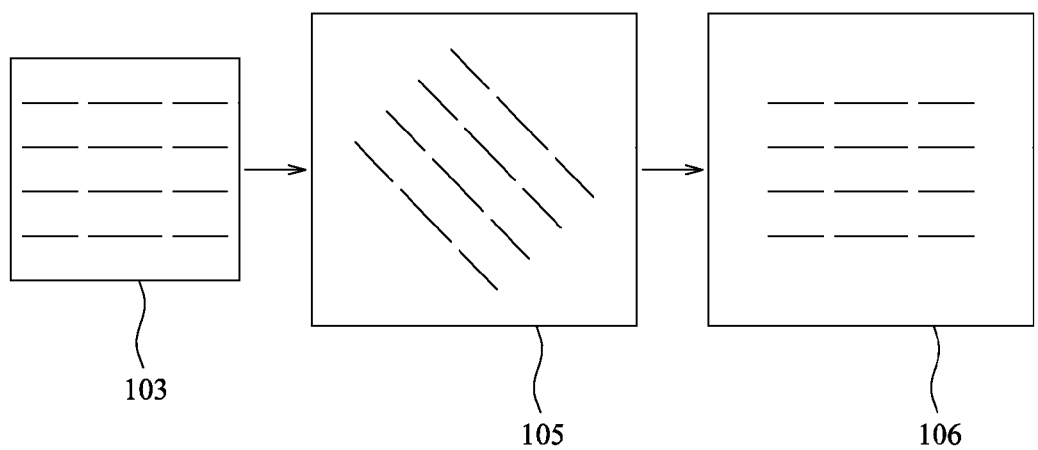
FIG. 1E illustrates a schematic view of a prior art for simply examining a sample by tilt-scan.

FIGS. 5A to 5G illustrate a series of steps of a method for examining a sample with scanning charged particle beam imaging apparatus according to another embodiment of the present invention. The present embodiment is similar with the previous embodiments illustrated in FIGS. 3A to 3H and FIGS. 4A~4I that a scan area and a corresponding image area are raster scanned by numerous scan lines. However, in the embodiment described here, the relative geometric relation between the scan area and the image area is different than that of the previous described embodiments. In the present embodiment, the sample illustrated in FIG. 1 may be examined by the following steps.

Figure 5A:
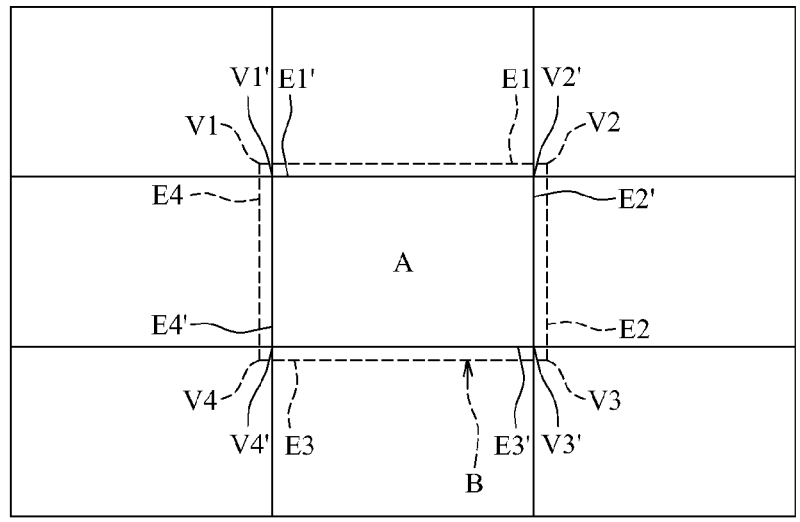
FIGS. 5A to 5G illustrate a series of steps of a method for examining a sample according to another embodiment of the present invention.

Referring to FIG. 5A, a scan area B located on the surface of the sample must be defined first. Herein, the image area A is entirely covered by the scan area B. Herein, a shape of the scan area B is essentially similar with a shape of the image area A and an area of the scan area B is also essentially similar with an area of the image area A (the size of the scan area is at most lightly larger than the size of the image area). In other words, the overlapped size between the scan area B and these neighboring image areas close to the image area A is significantly smaller than the overlapped size between scan area B and the image area A. Thereafter, the charged particle beam may scan through whole the scan area B along a direction D3 that is at a tilted angle neither parallel nor perpendicular to an orientation of the image area A. Please particularly note that the invention also allows the scan area B is entirely equal to the image A, both the shape and the size, if the practical scanning charged particle beam imaging apparatus can effectively adjust the scan lines used by the scan area B to precisely fit the image area A.

Figure 5B:
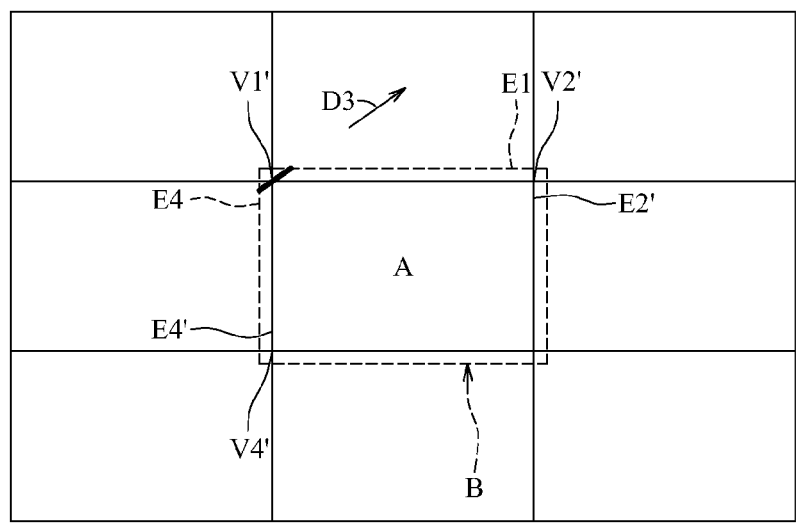

Then, referring to FIG. 5B, the charged particle beam is scanned from the edge E4 along the direction D3 through a portion of the image area A to the edge E1, wherein the portion of the image area A may be the vertex V1' or a portion close to the vertex V1'. Herein, the direction D3 is at a tilted angle neither parallel nor perpendicular to at least one of the edge E1, the edge E4, the edge E1' and the edge E4'. For example, the direction D3 could be parallel to a line linking two vertexes V2' and V4'.

Figure 5C:
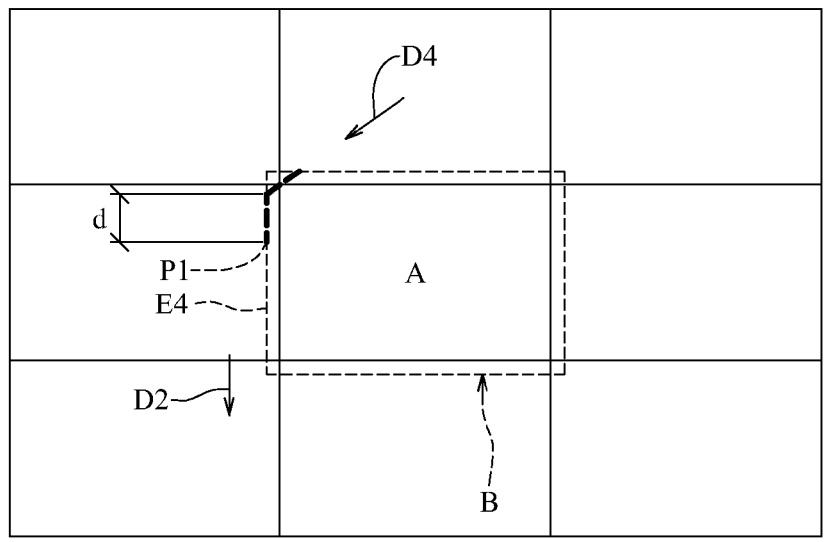

Next, referring to FIG. 5C, the charged particle beam is scanned back to a first point P1 on the edge E4, wherein the first point P1 is a distance d away from where the previous scanning step is started. How to move to the P1 is not limited in this embodiment. For example, the charged particle beam can be moved back to the edge E4 along a fourth direction D4 opposite to the direction D3 as illustrated in FIG. 5B, and moved to a distance d along the second direction D2 to the first point P1 on the edge E4. For example, the charged particle beam can be blanked out or turned off during the scanning back.

Figure 5D:
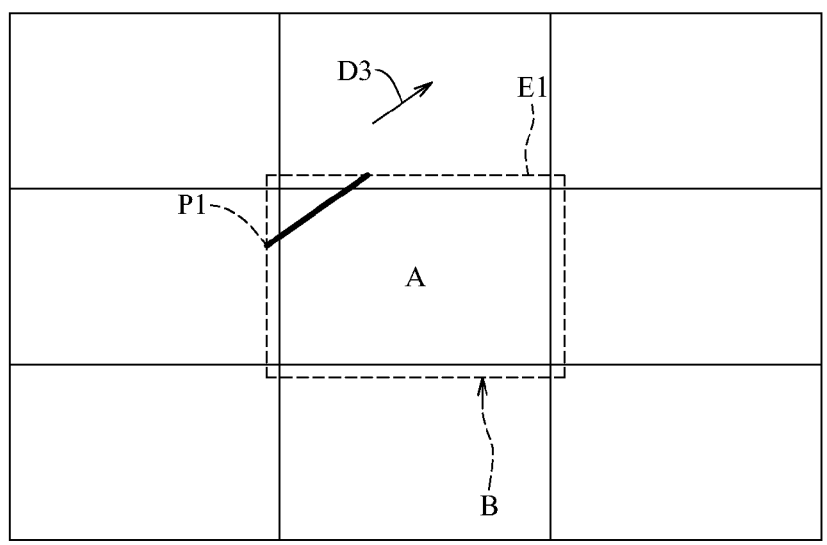

Thereafter, referring to FIG. 5D, the charged particle beam is scanned from the first point P1 along the direction D3 through another portion of the image area A to the edge E1.

Figure 5E:
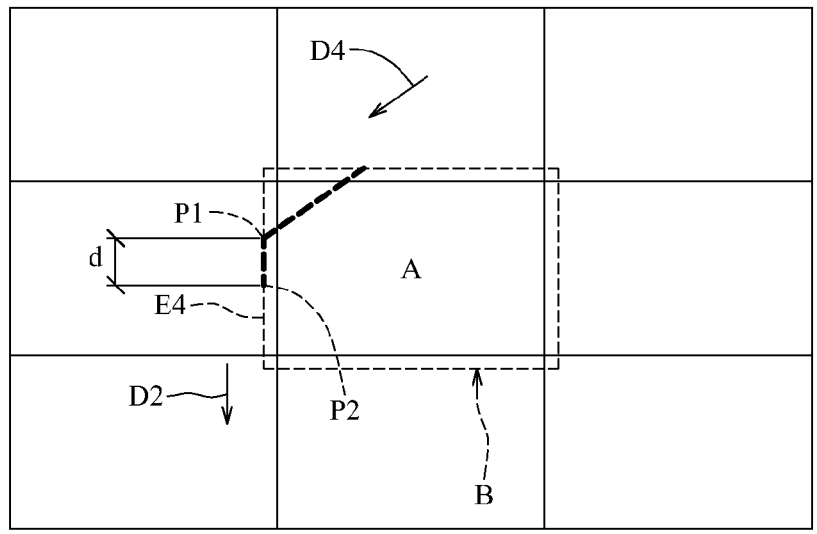

Then, referring to FIG. 5E, the charged particle beam is scanned back to a second point P2 on the edge E4, wherein the second point P1 also is a distance d away from the first point P1. For example, the charged particle beam may be scanned back to the first point P1 along the fourth direction D4, and moved to the distance d along the second direction D2 to a second point P2 on the edge E4. For example, the charged particle beam can be blanked out or turned off during the scanning back. After that, the steps illustrated above may be continuously repeated until the whole scan area B is scanned. Clearly, as discussed in the above embodiments, the embodiment does not restrict the details of these points, such as the distance between neighboring points and the arrangement of these points. Indeed, the only limitation is that all points are located on the edge E4. Besides, as discussed in the above embodiment, the embodiment also does not restrict how to move the projection of charged particle beam from an ending point of a previous scan route to the starting point of a next scan route.

Figure 5F:
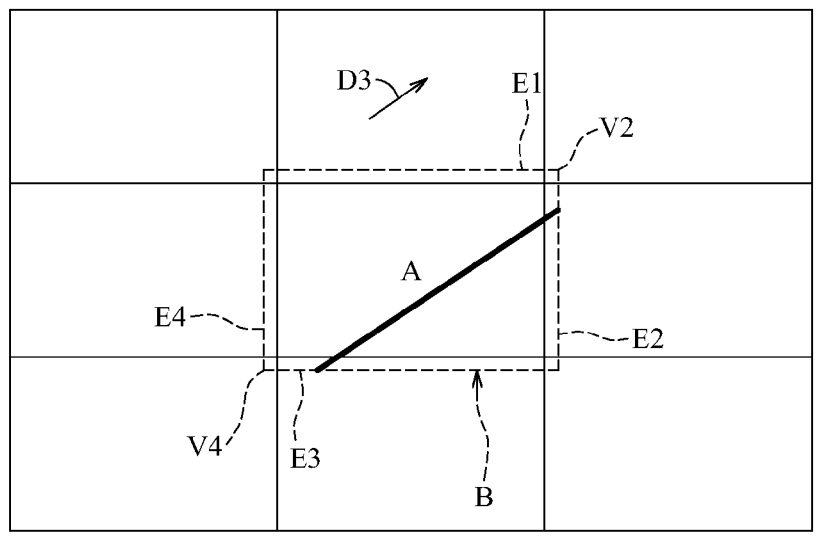

Next, referring to FIG. 5F, after scanning through a vertex V4 and/or a vertex V2, the charged particle beam may further optionally scan along the direction D3 from the edge E4/E3 to the edge E1/E2. Herein, the vertex V4 is an interaction of the edge E4 and the edge E3, and the vertex V2 is an interaction of the edge E1 and the edge E2. Clearly, the practical details of the step illustrated in FIG. 5F is at least dependent on the length of the edge E4, the length of the edge E1, and tilted angle is used.

Figure 5G:
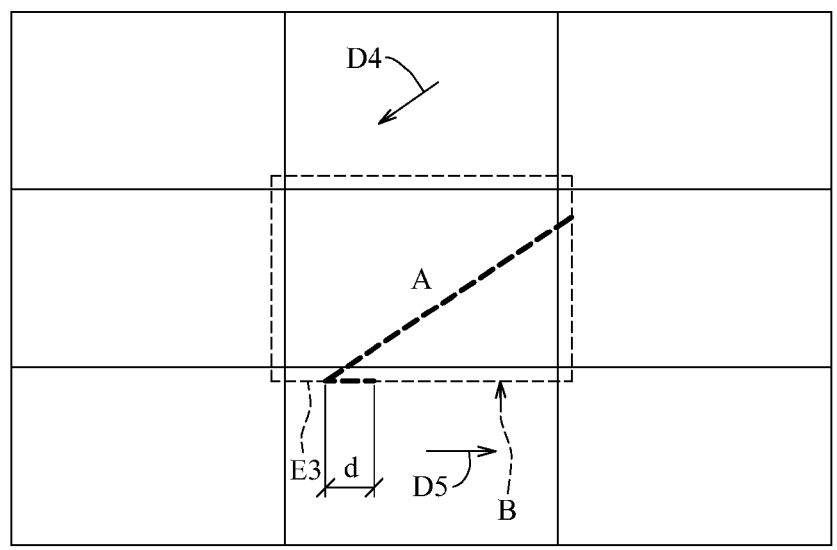

Thereafter, referring to FIG. 5G, the charged particle beam may be scanned back to the edge E3. For example, it may be scanned along the fourth direction D4 to the edge E3, and then moved a distance d along a fifth direction D5. Herein, the fifth direction D5 is parallel to the edge E3 and the charged particle beam is optional blanked out or turned off during the scanning back. Accordingly, the charged particle beam may scan the whole scan area B by repeating the steps illustrated above until the whole scan area B is scanned along the second direction D2 and the fifth direction D5.

Noted that the charged particle beam may further be blanked out or turned off when be scanned outside the image area A but inside any of the neighboring image area being close to the image area A. In other un-illustrated embodiments, the charged particle beam may further scan the scan area B along the direction D3 from the edge E4 to the edge E2, or from the edge E3 to the edge E1, for example in the case of sample with a shape a high aspect ratio rectangle. Accordingly, the method disclosed in the present embodiment may not only reduce the possibility of damaging other image areas being close to the image area A and an aliasing effect when scanning on the edges of microstructures inside the image area A, but also increase the throughput of the tilted scan process for examining the sample (Please particularly compare the size of overlapped portion of the neighboring image area with the size of the whole image area A).

In summary, the methods disclosed in the present invention may not only reduce the possibility of causing disadvantageousness on neighboring image areas close to the image area desired to be scanned, but also reduce the possibility of incurrence of an aliasing effect when scanning on the edges of microstructures inside the image area. In addition, the method disclosed in the present invention may increase the throughput of the scanning charged particle beam imaging apparatus.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for examining a sample with scanning charged particle beam imaging apparatus, comprising:
   specifying an image area and a scan area, wherein said image area is a portion of a surface of said sample and said scan area is an area to be scanned, wherein said image area is entirely covered with said scan area, wherein an orientation of said scan area is at a tilted angle neither parallel nor perpendicular to an orientation of said image area; and
   scanning said scan area via a charged particle beam through blanking said charged particle beam when scanning a portion of said scan area outside said image area and projecting said charged particle beam on said image area, wherein said charged particle beam is moved in parallel to said orientation of said scan area, wherein the portion of said scan area outside said image area is essentially not exposed to said charge particle beam.

2. The method as claimed in claim 1, wherein said charged particle beam is provided by a machine and said scan area is not larger than the maximum area that can be viewed by using said charged particle beam at the same time.

3. The method as claimed in claim 1, when said image area is a portion of a sampling region on said surface of said sample, further comprising a step of dividing said sampling region into a plurality of sub-regions, wherein each said sub-region could be viewed as a said image area being smaller than said scan area.

4. The method as claimed in claim 1, wherein a portion of said scan area proximate to said image area is exposed to said charged particle beam and a portion of said scan area far away from said image area is not exposed to said charged particle beam.

5. The method as claimed in claim 1, further comprising a step of checking whether a portion of said scan area is overlapped within said image area before scanning said portion of said scan area, and also further comprising a step of blanking said charged particle beam before scanning said portion of said scan area when said portion does not lie within said image area.

6. The method as claimed in claim 1, further comprising a step of reconstructing a non-tilted image from said scan area as if said charged particle beam scans in parallel to the orientation of pattern of said sample.

7. The method as claimed in claim 1, wherein when said scan area is a quadrangle with a edge along a first direction and a edge along a second direction and said image area is a quadrangle located inside said scan area and with its two opposite vertexes located on said edge and an edge opposite to said edge, said scan area is scanned according to the following process steps:
   (A1) blanking said charged particle beam when scanning along said first direction from a proximal end of said edge to a predetermined point on said edge, said proximal end being on an intersection of said first and edges, said predetermined point being on a proximal vertex of said image area;
   (A2) projecting said charged particle beam on said image area when scanning through said proximal vertex of said image area;
   (A3) blanking said charged particle beam when scanning along said first direction from said certain point of said edge to a distal end of said edge, said distal end being on an intersection of said edge and an edge opposite to said edge;
   (A4) scanning back to a first point, of said edge, said first point being a first distance away from said proximal end;
   (A5) blanking said charged particle beam when scanning along said first direction until scanning to an edge or a vertex of said image area;
   (A6) projecting said charged particle beam on said image area when scanning along said first direction within said image area until scanning to an another edge or another vertex of said image area;
   (A7) blanking said charged particle beam when scanning along said first direction from said another edge or said another vertex of said image area to said edge of said scan area opposite to said edge;
   (A8) scanning back to a second point of said edge, said second point being a second distances away from said first point; and
   (A9) repeating said steps (A5) to (A8) until said charged particle beam completely scan said scan area along said second direction.

8. The method as claimed in claim 7, further comprising a step of blanking said charged particle beam in at least one of the following steps: (A4) and (A8).

9. The method as claimed in claim 1, wherein when said scan area is a quadrangle with a edge along a first direction and a edge along a second direction and said image area is a quadrangle located inside said scan area and with its two opposite edges overlapping said edge and an edge opposite to said edge of said scan area, said scan area is scanned according to the process steps:
   (B1) projecting said charged particle beam on said proximal end of said edge, said proximal end being on a proximal vertex of said image area, said proximal end being on an interaction of said edge and said edge;
   (B2) blanking said charged particle beam when scanning along said first direction from said proximal end of said edge to a distal end of said edge, said distal end of said edge being on an interaction of said edge and an edge opposite to said edge;
   (B3) scanning back to a third point of said edge, said third point being a third distance away from said proximal end;
   (B4) scanning along said first direction from said edge to said edge opposite to said edge, wherein said charged particle beam is projected when scanning within said image area and is blanked when scanning outside said image area;
   (B5) scanning back to a fourth point of said edge, said fourth point being a fourth distance away from said third point; and
   (B6) repeating said steps (B4) to (B5) until said charged particle beam completely scans said scan area along said second direction.

10. The method as claimed in claim 9, wherein said step (B4) is selected from a group consisting of the following steps:
    when scanning from a portion of said edge overlapped within said image area to a portion of said edge opposite to said edge located, outside said image area, first projecting said charged particle beam when scanning within said image area and then blanking said charged particle beam when scanning outside said image area;
    when scanning from a portion of said edge overlapped within said image area to a portion of said edge opposite to said edge overlapped within said image area, continuously projecting said charged particle beam;

when scanning from a portion of said edge located outside said image area to a portion of said edge opposite to said edge overlapped within said image area, first blanking said charged particle beam when scanning outside said image area and then projecting said charged particle beam when scanning within said image area; and when scanning from a portion of said edge located outside said image area to a portion of said edge opposite to said edge located outside said image area, first blanking said charged particle beam when scanning outside said image area, then projecting said charged particle beam when scanning within said image area and finally blanking said charged particle beam when scanning outside said image area again.

11. The method as claimed in claim 9, further comprising a step of blanking said charged particle beam is at least one of the following steps: (B3) and (B5).

12. A method for examining a sample with scanning charged particle beam imaging apparatus, comprising:
specifying an image area and a scan area, wherein said image area is a portion of a surface of said sample and said scan area is an area to be scanned, wherein said image area is entirely covered with said scan area, wherein a shape of said scan area is similar with a shape of said image area, and wherein a size of said scan area is at most slightly larger than a size of said image area; and
scanning said scan area via a charged particle beam through blanking said charged particle beam when scanning, a portion of said scan area outside said image area and projecting said charged particle beam on said image area, wherein said charged particle beam is moved at a tilted angle neither parallel nor perpendicular to an orientation of said image area.

13. The method as claimed in claim 12, wherein said charged particle beam is provided by a scanning charged particle beam imaging apparatus and said scan area is not larger than the maximum area that can be viewed by using said charged particle beam at the same time.

14. The method as claimed in claim 12, when said image area is a portion of a sampling region over said surface of said sample, further comprising a step of dividing said sampling region into a plurality of sub-regions, wherein each said sub-region could be viewed as a said image area.

15. The method as claimed in claim 12, further comprising a step of reconstructing a non-tilted image from said scan area as if said charged particle beam scans in parallel to the orientation of pattern of said sample.

16. The method as claimed in claim 12, wherein when said scan area is a quadrangle angle with a edge along a first direction and a edge along a second direction, and when said image area is a quadrangle angle with a edge along a third direction and a edge with a fourth direction, said scan area is scanned by said charged particle beam according to the following process steps:
(C1) scanning from said edge along said fifth direction through a first portion of said image area to said edge, wherein said first portion of said image area is proximate to or equal to a proximal vertex of said image area, said proximal vertex is an interaction of said edge and said edge;
(C2) scanning back to a first point of said edge, said first point being a first distance away from a point where said scanning in step (C1) is started;
(C3) scanning from said edge along said fifth direction through a second portion of said image area to said edge;
(C4) scanning back to a second point of said edge, said second point being a second distance away from said first end; and
(C5) repeating said steps (C3) and (C4) until said charged particle beam completely scans said image area along said second direction.

17. The method as claimed in claim 16, further comprising a step of blanking said charged particle beam in said steps (C2) and (C4).

18. The method as claimed in claim 16, further comprising blanking said charged particle beam when said charged particle beam is moved outside said image area during the required transferring periods between said step (C1) and step (C2), step (C2) and step (C3), and step (C3) and step (C4).

19. The method as claimed in claim 16, wherein said fifth direction is neither parallel nor perpendicular to said third direction and said fourth direction.

20. The method as claimed in claim 16, wherein said fifth direction is parallel to a line linking two vertexes of said image area, wherein said two vertexes does not include said proximal vertex and a vertex opposite to said proximal vertex.

21. The method as claimed in claim 16, further comprising a step of scanning along said fifth direction to a fifth edge of said scan area when the sum of all movements along said edge is longer than a length of said edge, wherein said fifth edge is connected to said edge.

22. The method as claimed in claim 16, further comprising a step of moving back to an additional point of a sixth edge being connected to said edge when the sum of all movements along said edge is longer than a length of said edge, wherein said additional point is an additional distance away from last said point on said edge.

* * * * *